United States Patent [19]

Okinaga et al.

[11] Patent Number: 5,018,004
[45] Date of Patent: May 21, 1991

[54] SEMI-CONDUCTOR DEVICE

[75] Inventors: Takayuki Okinaga; Shouji Matsugami, both of Akishima; Yuuji Shirai, Kodaira; Kanji Otsuka, Higashiyamato; Hiroshi Koguma; Takashi Emata, both of Akishima, all of Japan

[73] Assignees: Hitachi, Ltd., Chiyoda; Hitachi VLSI Engineering Corp., Kodaira, both of Japan

[21] Appl. No.: 442,098

[22] Filed: Nov. 28, 1989

[30] Foreign Application Priority Data

Nov. 28, 1988 [JP] Japan .................................. 63-301905

[51] Int. Cl.$^5$ ...................... H01L 23/02; H01L 23/12; H01L 39/02
[52] U.S. Cl. ....................................... 357/74; 357/80; 357/81; 361/381; 361/383
[58] Field of Search ............................ 357/74, 80, 81; 361/381, 383; 174/16.3

[56] References Cited

U.S. PATENT DOCUMENTS

| | | |
|---|---|---|
| 4,561,010 | 12/1985 | Ogihara et al. ....................... 357/74 |
| 4,769,690 | 9/1988 | Suzuki et al. ........................ 357/67 |
| 4,868,638 | 9/1989 | Hirata et al. ........................ 357/72 |

FOREIGN PATENT DOCUMENTS

| | | | |
|---|---|---|---|
| 63-132465 | 6/1988 | Japan . | |
| 0199460 | 8/1989 | Japan | .................................... 357/74 |

*Primary Examiner*—Rolf Hille
*Assistant Examiner*—David Ostrowski
*Attorney, Agent, or Firm*—Pennie & Edmonds

[57] ABSTRACT

A semiconductor chip package technology which uses thin film wiring from the chip to the package terminals for increased line density and decreased parasitic capacitance and uses a thin film adhesion layer for improved heat conductivity between the package substrate and its sealing cap. The package uses a thin conductor film deposited along the element mounting surface of a sintered substrate. An adhesion layer, to provide a high quality bond between the sealing cap and substrate, is then deposited on the substrate peripheral area by successively laminating metal and metallized layers, or by depositing a single layer of low metal glass. The adhesion layer is thinner and of larger area than thick film technology, for improved heat conduction.

18 Claims, 5 Drawing Sheets

SEMI-CONDUCTOR DEVICE

BACKGROUND OF THE INVENTION

1. Field of the Invention

The present invention relates to a semiconductor device, and more specifically to a semiconductor die packaging technology which provides improved heat radiation performance and improved electrical characteristics for a semiconductor die mounted on the element-mounting surface of a sintered substrate which is sealed with a sealing cap.

2. Description of Prior Art

A semiconductor die is frequently a LSI logic circuit having a large number of input and output signals. The semiconductor die, or chip, is commonly sealed within a pin grid array (PGA)-type package, which can be provided with a large number of external terminals, and is therefore well suited as a package for the above-mentioned semiconductor chip. However, since the LSI logic circuit generates large amounts of heat, the PGA-type package must also have a considerable heat-radiating capability.

In a PGA-type package, a semiconductor chip is mounted on a central portion of the element-mounting surface of an electrically insulating sintered substrate. The sintered substrate is obtained, for example, by sintering and molding alumina at a high temperature. This substrate material exhibits excellent heat conductivity. The semiconductor chip is sealed in a cavity that is formed in the sintered substrate and is then covered by a sealing cap which is adhered via an adhesion layer formed around the substrate periphery, onto the element-mounting surface the substrate. The sealing cap is composed of, for example, alumina which is the same material as the sintered substrate. The result is that a PGA-type package of this type conducts most of the heat generated by the semiconductor chip out of the package to the sealing cap via a heat transfer path from the chip to the sintered substrate and then to the sealing cap via the adhesion layer.

Electrical connection from the semiconductor chip I/0 pads to the external PGA pins is via a line pattern of a thick conductor film, i.e., a metallized wiring is formed on the element-mounting surface of the sintered substrate of the PGA-type package. The thick conductor film is formed, for example, by applying a tungsten paste film using a screen printing technology method, and then carburizing the paste film at high temperatures.

Japanese Patent Laid-Open No. 132465/1988 discloses a method for increasing the number of external pins attainable using the PGA-type package method for a semiconductor device. According to this method, the thick conductor film is extended up to the peripheral portion of the element-mounting surface of the sintered substrate, i.e., up to the region where the sealing cap is adhered. The external pins, though, are arranged even on the device-mounting surface of the sintered substrate opposed to the region of adhesion. That increases the number of external pins by an amount equal to the number of external pins which are thus arranged on the device-mounting surface of the sintered substrate at position opposed to some regions in the adhesion region.

However, the present inventors have conducted basic study concerning the semiconductor device which employs the aforementioned PGA-type package, and have found the following problems:

The thick conductor film (metallized wiring) that extends on the element-mounting surface of the sintered substrate of the PGA-type package has a thickness of about 30 um and a width of about 200 um. The width, together with the minimum spacing limits the arrangement of external pins. Moreover, the thick conductor film is formed by carburizing a metal paste which has both a high sheet resistance (approaching 30 milliohms/□) and a large parasitic capacitance, because of its wide surface area as described above. This results in a high RC time constant which in turn lowers the operational clock rate of the packaged semiconductor chip.

Furthermore, because of its large thickness, the thick conductor film produces a resistance in the heat transfer path from the sintered substrate to the sealing cap. The reason for this increased heat resistance is that the part of the thick conductor film that extends up to the peripheral portion of the element-mounting surface of the sintered substrate substantially decreases the adhesion area in the adhesion region between the sintered substrate and the sealing cap. The reduced adhesion area increases the heat resistance of the heat transfer path across the adhesion region, and therefore the heat-radiating performance of the semiconductor device decreases.

SUMMARY OF THE INVENTION

The object of the present invention is to provide a means to improve the heat-radiating performance of the packaged semiconductor device, by overcoming the aforementioned problem of the prior art.

Another object of the present invention is to provide a means which improves both the heat-radiating performance and the electric characteristics of the packaged semiconductor device.

Still another object of the present invention is to provide means to improve the heat-radiating performance and the electric characteristics of the semiconductor device, and further to attain an increased number of semiconductor package external pins.

The above and other objects as well as novel features of the present invention will become obvious from the detailed description of the specification and the accompanying drawings.

According to the present invention a thin conductor film is extended from the central portion and to the peripheral portion on the element-mounting surface of the sintered substrate to connect the semiconductor chip to the package external terminals. A sealing cap is then adhered, via an adhesion layer, onto the peripheral portion of the element-mounting surface of the sintered substrate and onto the thin conductor film that extends on the peripheral portion. The thin conductor film is deposited by a vaporization method, sputtering method or a like method.

The adhesion layer mentioned above comprises a composite film obtained by successively laminating metallized films and metal films, which as will become obvious, provides an adhesion area greater than the adhesion areas of the metallized films on the side of the element-mounting surface of the sintered substrate.

A sealing cap is then adhered, via the adhesion layer, onto the peripheral portion of the element-mounting surface of the sintered substrate and onto the thin conductor film that extends on the peripheral portion.

According to the aforementioned means, a thin conductor film is deposited instead of the thick conductor film of prior art, and extends along the element-mounting surface of the sintered substrate. The thin film, as implemented in this invention, decreases the resistance and parasitic capacitance. The improved electrical characteristic provides increased signal transmission speed. Moreover, the thin conductor film has a small thickness in the periphery thereof and its thermal resistance can be virtually neglected. In addition, the adhesion region has an increased adhesion area between the sintered substrate and the sealing cap, which further decreases heat resistance in the heat transfer path between the sintered substrate and the sealing cap. Therefore, the thin conductor film provides a substantial improvement in the package's heat-radiating performance.

The thin conductor film can be extended up to the adhesion region in the periphery of the sintered substrate, and external pins can be arranged on the device-mounting surface of the sintered substrate opposed to the adhesion region. As a result it is possible to obtain a semiconductor device with an increased number of terminals.

It is also possible to decrease the width of the thin conductor film and the distance between the conductor films that extend on the element-mounting surface of the sintered substrate, making it possible to increase the number of the thin conductor films and, hence, to obtain a semiconductor device with an increased number of terminals.

DETAILED DESCRIPTION

Figure 1:
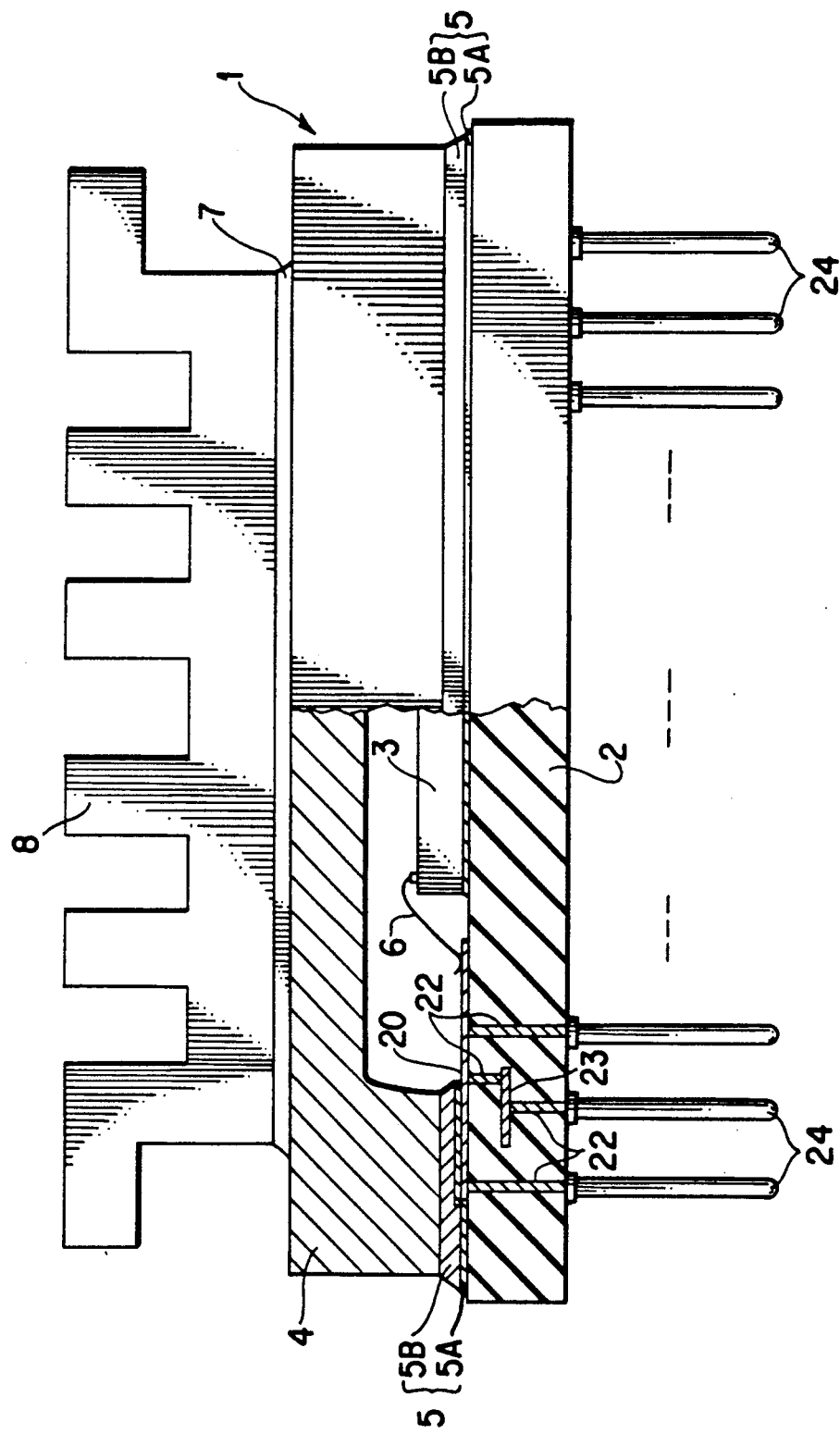
FIG. 1 is a view illustrating partly in cross section the semiconductor device.

The invention will now be described in conjunction with an embodiment in which the invention is adapted to a semiconductor device that employs the PGA-type package.

In all of the drawings relating to this embodiment, the parts having the same functions are denoted by the same reference numerals but will not be discussed or described again.

Embodiment I

FIG. 1 (partial section view) schematically illustrates a semiconductor device employing a PGA-type package according to embodiment I of the present invention.

As shown in FIG. 1, a semiconductor chip 3 is mounted in a cavity on a central portion of the element-mounting surface of a sintered substrate 2 and is hermetically sealed with a sealing cap 4. The cavity is chiefly formed by a recessed portion formed in the sealing cap 4 which is adhered via an adhesion layer 5 onto the periphery of the element- mounting surface of the sintered substrate 2.

The sintered substrate 2 comprises, for example, an alumina substrate which has a good heat conductivity and a high electrical insulating property. The sintered substrate 2 may also be constituted of mullite aluminum nitride, silicon carbide, or beryllium.

Figure 2:
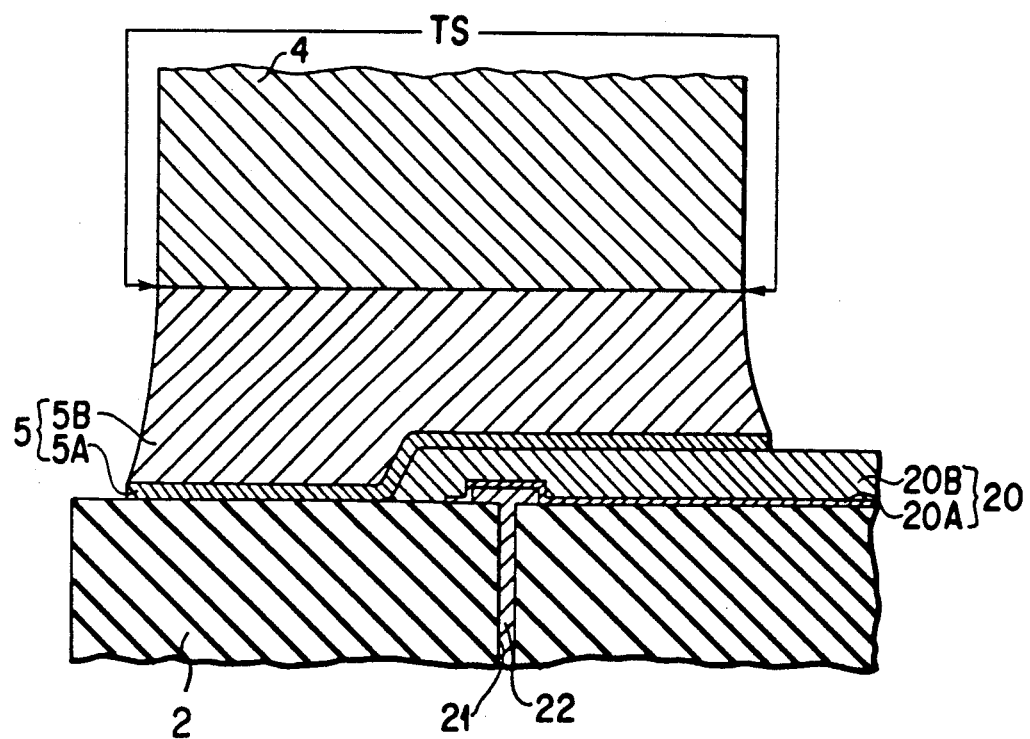
FIG. 2 is a section view illustrating, on an enlarged scale, major portions of a semiconductor device employing the PGA-type package according to embodiment I of the present invention.

A multilayer conductor layer 20 is disposed on the element-mounting surface of the sintered substrate 2 from the surrounding area of the semiconductor chip 3 to the periphery of the element-mounting surface. As shown in FIG. 2, the multilayer conductor layer 20 comprises two or more thin conductor films 20A which comprise aluminum films deposited, for example, by the vaporization method or the sputtering method (for simplicity, this embodiment shows only one layer). Though not shown, interlayer insulating films are formed among the thin conductor films 20A. The aluminum film has a thickness typically ranging from 4 to 6 um and a width of about 30 to 50 um as formed by photolithography technology. In other words, the thin conductor film 20A has a thickness which is about 1/5 to ⅓ of that of a comparable thick conductor film, and has a width about ⅓ to 1/7 of the thick film. Furthermore, the aluminum film deposited by the vaporization or sputtering method is subjected to a predetermined heat treatment so as to have a sheet resistance as low as 6 to 8 milliohms/☐. In other words, the thin conductor film 20A has a sheet resistance which is as low as about ⅓ to 1/7 that of the thick conductor film. The thin conduction film 20A can also be constituted of a single layer of metal such as copper, a high-melting metal (W, Mo, and the like), or could be a composite film formed by successively laminating nickel films. Furthermore, the thin film 20A is not limited to the above-mentioned deposition method, and may be deposited, for example, by the CVD method or the plating method. The thin conductor film 20A can be positively extended up to the periphery (adhesion region) of the element-mounting surface o the sintered substrate 2.

As shown in FIG. 2, the surface of the thin conductor film 20A is covered with an insulating film 20B, which is a material having a low dielectric constant. Therefore, the insulating film 20B functions to decrease the parasitic capacitance of the thin conductor film 20A. Examples of the insulating film 20B include a silicon oxide film (having a dielectric constant of =3.9), a polyamide resin fill ($\epsilon=3.5$), a fluorine-containing resin fill ($\epsilon=2.5$), a polystyrene film ($\epsilon=3.5$), or a Maleimide film (trade name, $\epsilon=2.3$, produced by Hitachi, Ltd.). The insulating film 20B has a thickness of, for example, about 5 to 15 um.

As shown in FIG. 1, one end of the thin conductor film 20A extends to the central portion of the element-mounting surface of the sintered substrate 2 and is connected to a bonding pad of the semiconductor chip 3. The connection between one end of the thin conductor 20A and the external terminal of the semiconductor chip 3 is made via a bonding wire 6 which comprises, for example, gold, aluminum, or the like, depending upon the material of the thin conductor film 20A. Though not shown, the connection between the one end of the thin conductor film 20A and the bonding wire 6 is effected through an opening formed in the insulating film 20B.

The other end of the thin conductor film 20A is connected to a package terminal connection through hole wiring 22 as shown in FIGS. 1 and 2. The connection hole wiring 22 is buried in a through hole 21 formed in the sintered substrate 2. The connection hole wiring 22 is formed by burying a metal paste in the connection hole 21 prior to sintering and molding the substrate 2 and carburizing the metal paste. That is, the connection hole wiring 22 is formed by the metallizing method such as used for a thick conductor film. The connection hole wiring 22 is composed of, for example, a high-melting metal such as tungsten. The connection hole wiring 22 is connected to an external terminal pin 24 directly or via a thick conductor film 23 that is formed in the sintered substrate 2.

The external pins 24 are arranged, in a plural number, on the device-mounting surface opposed to the element-mounting surface of the sintered substrate 2. The external pins 24 are provided on the sintered substrate 2 so as, for a PGA-type package, to protrude in a substantially perpendicular manner relative to the device.

The sealing cap 4 may comprise, for example, alumina having a high heat conductivity. Alternately, the sealing cap 4 may comprise aluminum nitride, silicon carbide, or beryllia.

The adhesion layer 5 for adhering the sealing cap 4 to the periphery of the element-mounting surface of the sintered substrate 2 is constituted, as shown in FIGS. 1 and 2, by a laminate of the metallized film 5A and the metal film 5B. The metallized film 5A is directly adhered onto the side of the element-mounting surface of the sintered substrate 2. The metal adhesion film 5B is adhered to the sealing cap 4. A multilayer conductor film 20 (thin conductor film 20A and insulating film 20B) extends on the adhesion region in the periphery of the element-mounting surface of the sintered substrate 2. The adhesion layer 5 is provided on the periphery of the element-mounting surface of the sintered substrate 2 and on the multilayer conductor film 20 that extends up to the peripheral portion.

Within the adhesion layer 5, the metallized film 5A of the lower side, comprising an inorganic material, is provided to enhance the adhesiveness of the upper metal film 5B and to prevent water outside the device from infiltrating into the cavity. Furthermore, the metallized film 5A has a good heat conductivity which decreases the heat resistance in the heat transfer path from the sintered substrate 2 to the sealing cap 4. The metallized film 5A is composite film (Au/Ni/Cu/Ti) obtained by successively depositing, for example, titanium, copper, nickel and gold from the side of the element-mounting surface of the sintered substrate 2. The titanium film has a thickness of about 5 um, nickel film has a thickness of about 1 um, and gold film has a thickness of about 1 um.

Also, within the adhesion layer 5, the upper metal film 5B is provided for the purpose of substantially adhering the sintered substrate 2 and the sealing cap 4 together. Similar to the film 5A, the metal film 5B comprises a metal that has a good heat conductivity so that the heat resistance is decreased in the heat transfer path from the sintered substrate 2 to the sealing cap 4. The metal film 5B comprises, for example, a gold-tin (Au-Sn) alloy or a solder (Pb-Sn). The metal film 5B for adhesion is formed maintaining a thickness of, for example, about 100 to 200 um.

In this embodiment, as described above, the thin conductor film 20A is extended on the central portion and the peripheral portion of the element-mounting surface of the sintered substrate 2 to connect the semiconductor chip 3 to the external device. The sealing cap 4 is then adhered, via the adhesion layer 5, onto the periphery of the element-mounting surface of the sintered substrate 2 and onto the thin conductor film 20A that extends to the periphery. Owing to this construction the thin conductor film 20A is formed and extends along the element-mounting surface of the sintered substrate 2, which significantly decreases the resistance and parasitic capacitance relative to a thick film conductor wiring. Therefore, the signal transmission speed of the semiconductor device can be increased. Furthermore, the periphery of the thin conductor film 20A has such a small thickness that its heat resistance can be virtually neglected. Also, the adhesion area can be increased in the adhesion region between the sintered substrate 2 and the sealing cap 4. The conductor film's small thickness and the increased adhesion area cause the heat resistance of the heat transfer path between the sintered substrate 2 and the sealing cap 4 to be decreased, making it possible to improve the heat-radiating capability of the semiconductor device 1. That is, the multilayer conductor film 20 has a thickness which is as low as one-tenth the thickness of the adhesion layer 5, as shown in FIG. 2. This along with the aforementioned large adhesion area improves the heat conduction that can be maintained irrespective of the presence of the multilayer conductor film 20 on the adhesion region. As shown in FIG. 2, the size TS of the heat transfer path from the sintered substrate 2 to the sealing cap 4 corresponds to the size of the whole region of the adhesion region.

The thin conductor film 20A extends to the adhesion region in the periphery of the sintered substrate 2, and external pins 24 are arranged on the device-mounting surface of the sintered substrate 2, opposite to the adhesion region, enabling the semiconductor device 1 to be provided with an increased number of terminals.

In addition, the width of the thin conductor film 20A that extends on the element-mounting surface of the sintered substrate 2 may be decreased, and therefore decrease the distance among the thin conductor films. This makes it possible to increase the number of the thin conductor films 20A and increase the number of terminals of the semiconductor device 1.

Furthermore, though not shown, it is possible to increase the area of the periphery of the sintered substrate 2 by increasing the region in which the metallized film 5A comes into direct contact with the element-mounting surface of the sintered substrate 2. The increased area of the periphery of the sintered substrate 2 works as a heat-radiating portion without any external pin 24 on the device-mounting surface. This increased area contributes to enhancing the heat-radiating performance of the semiconductor device 1.

On the upper side of the sealing cap 4 of the semiconductor 1, as shown in FIG. 1, heat-radiating fins 8 are attached by an adhesion layer 7. The heat-radiating fins 8 are made of a material having a good heat conductivity, comparable to that of the sealing cap 4.

Embodiment II

Figure 3:
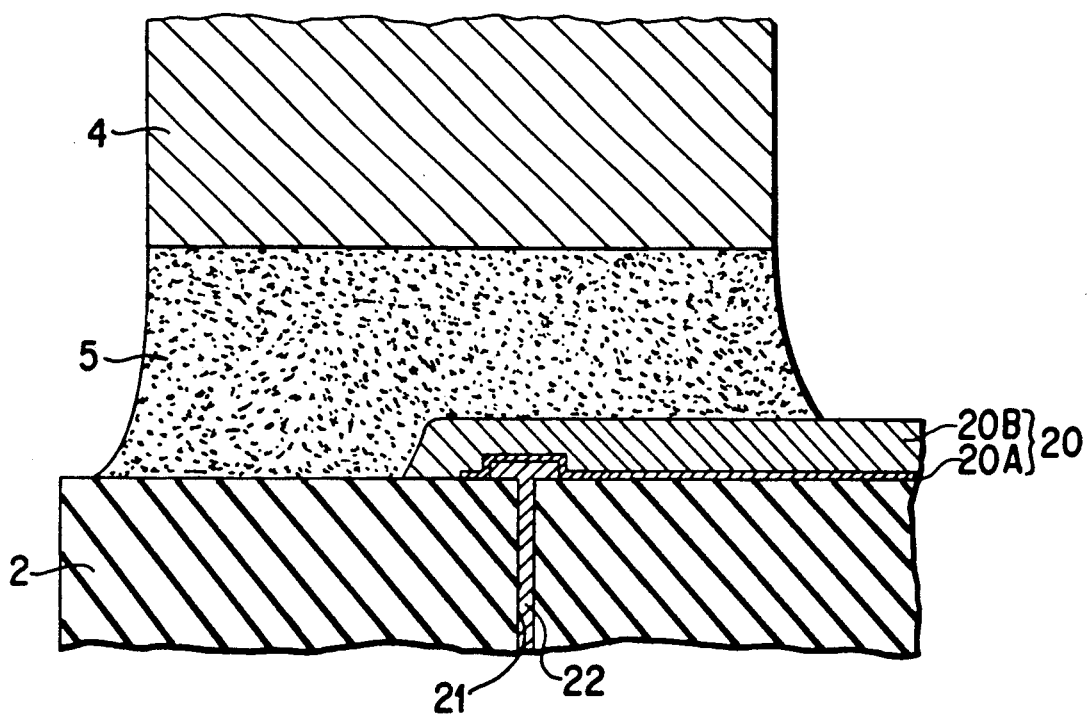
FIG. 3 is a section view illustrating, on an enlarged scale, major portions of a semiconductor device employing the PGA-type package according to embodiment II of the present invention.

Embodiment II, as shown in FIG. 3, illustrates a second embodiment of the present invention employing a PGA-type package wherein the sintered substrate and the sealing cap are adhered together with a low-melting glass.

In the semiconductor device 1 of this embodiment the sealing cap 4 is adhered via the adhesion layer 5 onto the periphery of the element-mounting surface of the sintered substrate 2, and onto the multilayer conductor film 20 that extends up to the periphery. The fundamental structure of the adhesion layer 5 comprises a low-melting glass film (lead glass film).

The semiconductor device 1 of this embodiment exhibits substantially the same effects as those of the aforementioned embodiment I. The primary difference is that, although low-melting glass film adhesion layer 5 exhibits a slightly lower heat conductivity than that of the metallic adhesion layer 5, the adhesion layer 5 of this embodiment is a single-layer structure which helps simplify the structure of the semiconductor device 1.

Embodiment III

Figure 4:
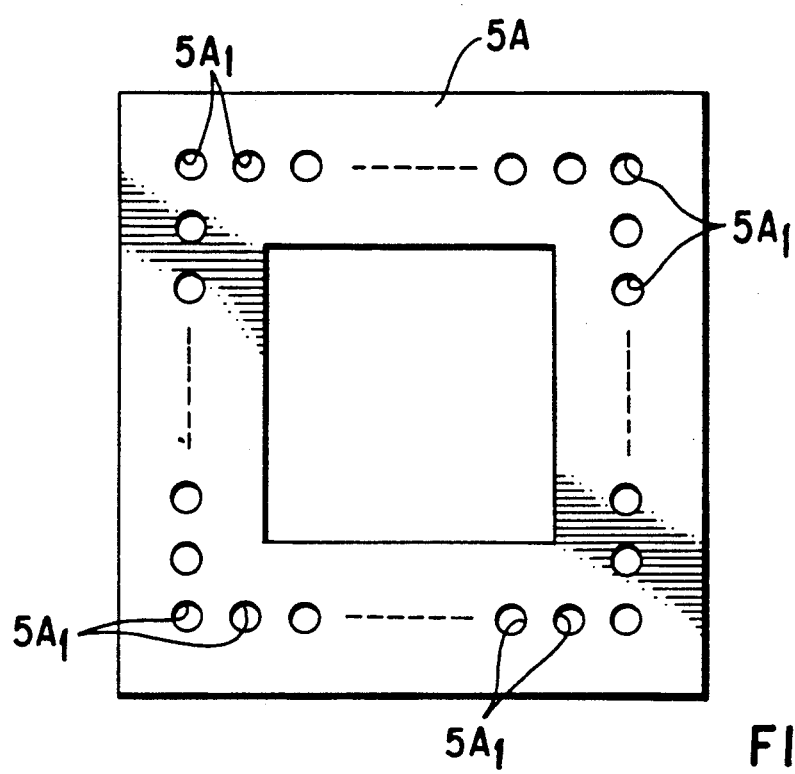
FIGS. 4 and 5 are plan views of major portions showing the shapes of an adhesion layer used for a semiconductor device that employs the PGA-type package according to embodiment III of the present invention.
Figure 5:
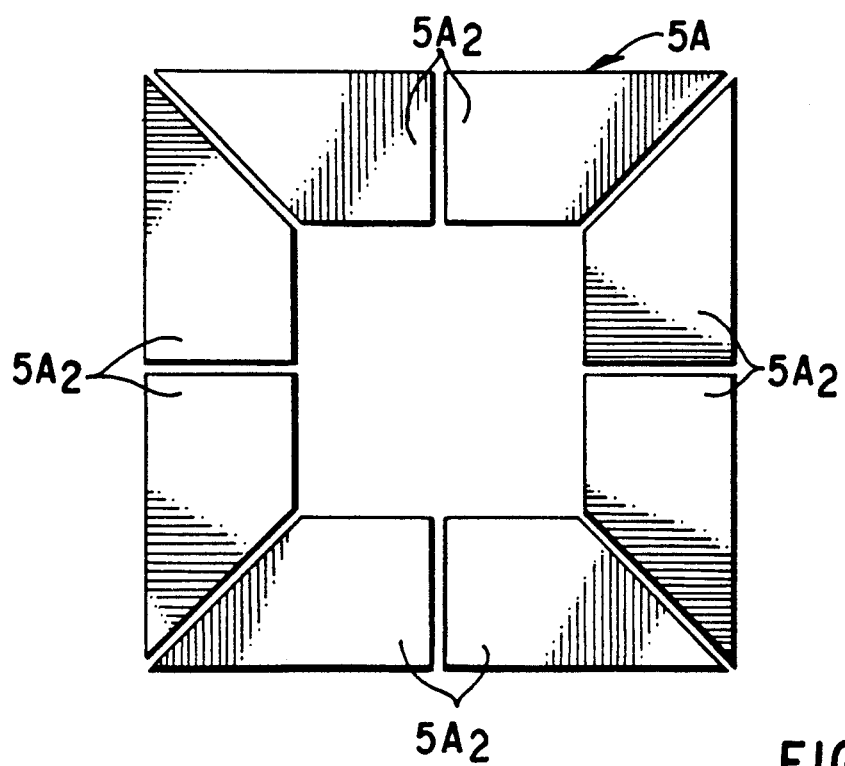

Embodiment III is a third embodiment of the present invention, similar to the semiconductor device explained in embodiment I but in which the shape of the lower metallized film within the adhesion layer is changed to adhere the sintered substrate and the sealing cap together. FIGS. 4 and 5 illustrate the shape of the adhesion layer used in the semiconductor device employing the PGA-type package according to this embodiment.

In the semiconductor device 1 of this embodiment the metallized film 5A on the lower side of the adhesion layer 5 is constituted as shown in FIG. 4. That is, the metallized film 5A is provided with a plurality of through holes $5A_1$ which are arranged at portions to be superposed on the insulating film 20B of the multilayer conductor film 20 formed on the element-mounting surface of the sintered substrate 2. In other words, the metallized film 5A is not formed on the whole surface of the insulating film 20B but is formed partially. This is of particular importance when the insulating film 20B comprises a resin-type material. The reason is that gases evolved from the insulating film (resin-type material) 20B during the step of forming the semiconductor device 1 or during its operation are stored in the cavities formed by the through holes $5A_1$ in the metallized film 5A. Therefore, the through holes $5A_1$ prevent the metallized film 5A and the insulating film 20B from peeling from their respective interface due to gases evolved from the insulating film 20B. This has the benefit of improving resistance against moisture and increasing the electric reliability of the semiconductor device 1.

Furthermore, the metallized film 5A (or and alloy film 5B for adhesion) of the semiconductor device 1 shown in FIG. 4 may be maintained at a predetermined fixed voltage potential, such as a reference potential, ground, or a power source potential. The fixed potential is applied to the metallized film 5A by, for example, making a connection to the thin conductor film 20A on the multilayer conductor film 20 or to the connection hole wiring 22.

The benefits obtained by maintaining the metallized film 5A at a fixed potential include improved impedance characteristics, decreased crosstalk, and decreased noise. In the semiconductor device 1 of embodiment III as shown in FIG. 5, the metallized film 5A may be divided into a plurality of portions $5A_2$. The divided portions $5A_2$ of the metallized film 5A can be each connected to the same fixed potential or to different respective potentials. The construction of FIG. 5 exhibits the same effects as those of the aforementioned semiconductor device 1 shown in FIG. 4.

Embodiment IV

Figure 6:
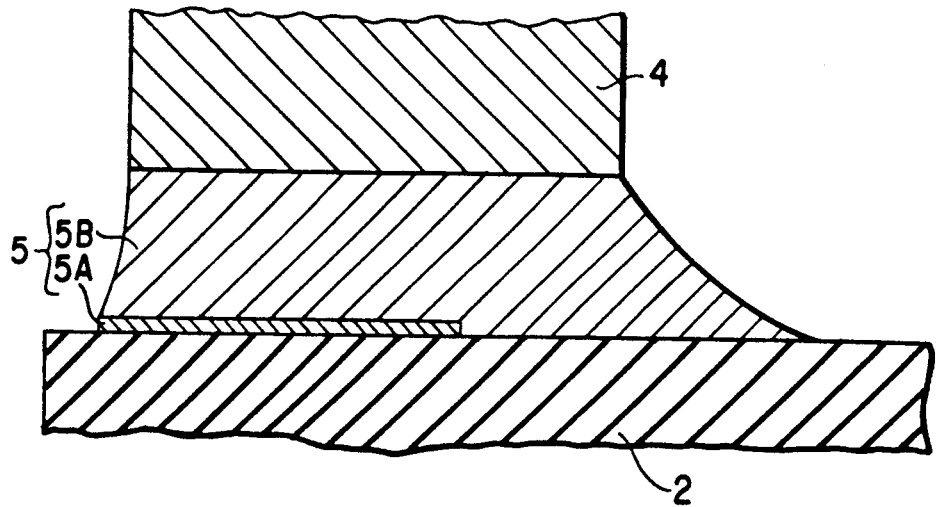
FIGS. 6 and 7 are section views illustrating, on an enlarged scale, major portions of a semiconductor device which employs the PGA-type package according to embodiment IV of the present invention.
Figure 7:
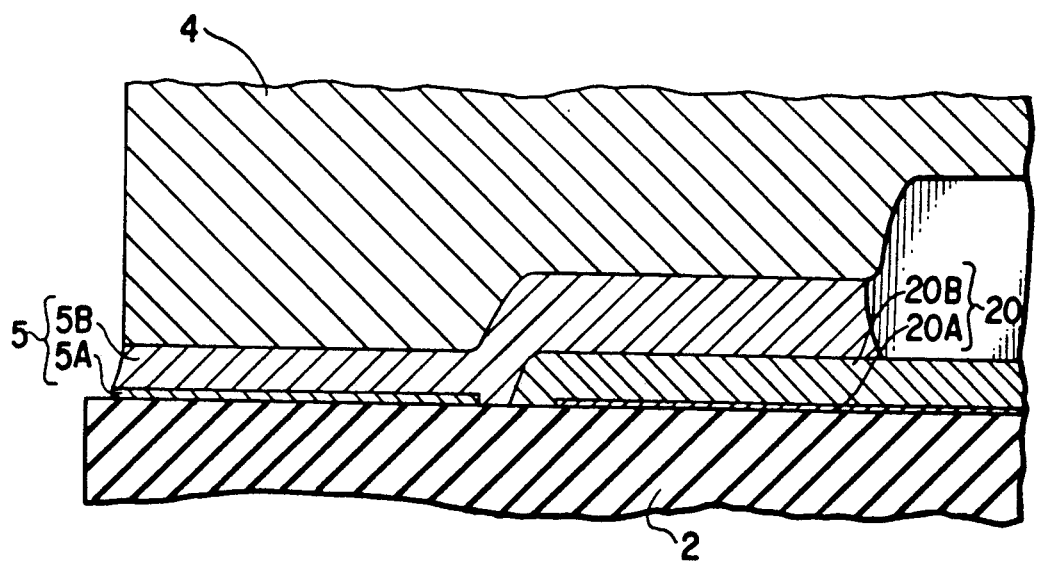

Embodiment IV, illustrated in FIGS. 6 and 7, is a fourth embodiment of the present invention which is concerned with the semiconductor device explained in embodiment I but in which the heat-radiating performance is enhanced by changing the shape of the metal layer that adheres the sintered substrate and the sealing cap together.

In the semiconductor device of embodiment IV, as shown in FIG. 6, the metal film 5B for adhesion of the upper side of the adhesion layer 5 has an adhesion area greater than the adhesion area of the metallized film 5A of the lower side. The metallized film 5A of the lower side of the adhesion layer 5 is provided on the peripheral edge of the element-mounting surface of the sintered substrate 2. This is done both to define the region which adheres to the metal film 5B and to prevent the infiltration of water from the outside of the device. In addition, metal film 5B has an increased adhesion area which decreases the heat resistance of the adhesion region in the heat transfer path.

In the semiconductor device 1 as described above, the composite film adhesion layer 5 is obtained by successively laminating the metallized film 5A and the metal film 5B onto the element-mounting surface of the sintered substrate 2. With this constitution, the metal film 5B for adhesion on the upper side of the adhesion layer 5 functions to increase the adhesion area of the adhesion region and decrease the heat resistance in the heat transfer path between the sintered substrate 2 and the sealing cap 4. This provides the semiconductor device 1 with enhanced heat-radiating performance.

In the semiconductor device 1 of this embodiment, as shown in FIG. 7, the sealing cap 4, in the region where the multilayer conductor film 20 extends, may be formed in a recessed shape. The multilayer conductor film 20 that extends to the adhesion region has such a small thickness that it does not substantially serve as heat resistance, as is explained in embodiment I.

In the semiconductor device 1 of this embodiment described above, the thin conductor film 20A is extended on the central portion of the element-mounting surface of the sintered substrate 2 and on the periphery thereof to connect the semiconductor chip 3 to the external device. The sealing cap 4 is then adhered via the adhesion layer 5 onto the periphery of the element-mounting surface of the sintered substrate 2 and onto the thin conductor film 20A that extends to the periphery. This constitution makes it possible to obtain the effects of the semiconductor device 1 of FIGS. 1 and 2, as explained in embodiment I, as well as the effects of the semiconductor device 1 shown in FIG. 6.

In the foregoing were concretely described the invention accomplished by the present inventors by way of embodiments. However, the invention is in no way limited to the aforementioned embodiments, but can be modified in a variety of other ways without departing from the gist and scope of the invention.

For instance, the invention can be adapted to a semiconductor device employing a PGA-type package in which a plurality of semiconductor dice are mounted on the element-mounting surface of the sintered substrate directly or via a mother chip.

What is claimed:

1. A semiconductor device of pin grid array-type package comprising:
   a substrate having one side with a semiconductor chip mounting surface at a central portion thereof, a cap mounting surface formed on the periphery of said one side, and a back surface opposite to said one side, a semiconductor chip mounted on said semiconductor chip mounting surface and a plurality of external pins formed on said back surface;
   thin conductor films formed on said one side and said films extending from said semiconductor mounting surface to said cap mounting surface, said plurality of external pins being electrically connected to said thin conductor films;
   a plurality of wires electrically connecting said thin conductor films and said chip;
   a cap for sealing said chip, said cap being attached to said cap mounting surface; and
   an adhesion layer for adhering said cap to said cap mounting surface, said adhesion layer covering a portion of said thin conductor films within said cap mounting surface.

2. A semiconductor device of pin grid array-type package according to claim 1, further comprising:
   a metal layer formed between said cap and said substrate within said cap mounting surface.

3. A semiconductor device of pin grid array-type package according to claim 1, further comprising:
   an insulating film formed on said thin conductor films for shielding said thin conductor films from said adhesion layer.

4. A semiconductor device of pin grid array-type package according to claim 1, wherein said substrate is comprised one of alumina, mullite aluminum nitride, silicon carbide and beryllia.

5. A semiconductor device of pin grid array-type package according to claim 1, wherein said cap is comprised one of alumina, mullite aluminum nitride, silicon carbide and beryllia.

6. A semiconductor device of pin grid array-type package according to claim 1, wherein said adhesion layer is made of a low-melting glass film.

7. A semiconductor device of pin grid array-type package according to claim 2, further comprising:
   a plurality of through holes formed through said metal layer in said portion which overlaps with said thin conductor films.

8. A semiconductor device of pin grid array-type package according to claim 2, wherein said metal layer is made of a composite film lamination of titanium, copper, nickel and gold.

9. A semiconductor device of pin grid array-type package according to claim 1, wherein said adhesive layer is made of an alloy of gold and tin.

10. A semiconductor device of pin grid array-type package according to claim 1, wherein said adhesive layer is made of solder.

11. A semicondcutor device of pin grid array-type package comprising:
    a substrate having one side with a semiconductor chip mounting surface at a central portion thereof, a cap mounting surface formed on the periphery of said one side, and a back surface opposite to said one side, a semiconductor chip mounted on said semiconductor chip mounting surface and a plurality of external pins formed on said back surface;
    thin conductor films formed on said one side and said films extending from said semiconductor mounting surface to said cap mounting surface, and said plurality of external pins being electrically connected to said thin conductor films;
    a plurality of wires electrically connecting said thin conductor films and said chip;
    a cap for sealing said chip, said cap being attached to said cap mounting surface; and
    an adhesion layer for adhering said cap to said cap mounting surface, said adhesion layer covering a portion of said thin conductor films within said cap mounting surface; and
    a metal layer formed between said cap and said substrate, wherein width of said adhesion layer is greater than that of said metal layer.

12. A semiconductor device of pin grid array-type package according to claim 1, further comprising:
    an insulating film formed on said thin conductor films for shielding said thin conductor films from said adhesion layer.

13. A semiconductor device of pin grid array-type package according to claim 11, wherein said substrate is comprised one of alumina, mullite aluminum nitride, silicon carbide and beryllia.

14. A semiconductor device of pin grid array-type package according to claim 11, wherein said cap is comprised one of alumina, mullite aluminum nitride, silicon carbide and beryllia.

15. A semiconductor device of pin grid array-type package according to claim 14, further comprising:
    a plurality of through holes formed through said metal layer in said portion which overlaps with said thin conductor films.

16. A semiconductor device of pin grid array-type package according to claim 12, wherein said metal layer is made of a composite film lamination of titanium, copper, nickel and gold.

17. A semiconductor device of pin grid array-type package according to claim 11, wherein said adhesive layer is made of an allow of gold and tin.

18. A semiconductor device of pin grid array-type package according to claim 11, wherein said adhesive layer is made of solder.

* * * * *